United States Patent
Nobira (10) Patent No.: US 11,041,886 B2
(45) Date of Patent: Jun. 22, 2021

(54) CURRENT SENSOR

(71) Applicant: Asahi Kasei Microdevices Corporation, Tokyo (JP)

(72) Inventor: Ryuji Nobira, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 243 days.

(21) Appl. No.: 16/253,242

(22) Filed: Jan. 22, 2019

(65) Prior Publication Data
US 2019/0154737 A1 May 23, 2019

Related U.S. Application Data

(63) Continuation of application No. PCT/JP2017/026018, filed on Jul. 19, 2017.

(30) Foreign Application Priority Data

Jul. 22, 2016 (JP) .............................. JP2016-144742

(51) Int. Cl.
*G01R 15/20* (2006.01)
*G01R 19/00* (2006.01)

(52) U.S. Cl.
CPC ........... *G01R 15/202* (2013.01); *G01R 15/20* (2013.01); *G01R 19/00* (2013.01)

(58) Field of Classification Search
CPC .. G01R 15/202; G01R 19/00; G01R 19/0069; G01R 19/0092; G01R 19/08; G01R 15/20; G01R 15/205; G01R 15/207; G01R 21/06; G01R 21/08
See application file for complete search history.

(56) References Cited

U.S. PATENT DOCUMENTS

| | | | | |
|---|---|---|---|---|
| 5,124,624 A | * | 6/1992 | de Vries | G01R 21/08 324/142 |
| 2005/0045359 A1 | * | 3/2005 | Doogue | G01R 15/207 174/536 |
| 2006/0219436 A1 | | 10/2006 | Taylor | |

(Continued)

FOREIGN PATENT DOCUMENTS

| EP | 2466325 A1 | 6/2012 |
|---|---|---|
| EP | 3206037 A1 | 8/2017 |

OTHER PUBLICATIONS

International Search Report for International Patent Application No. PCT/JP2017/026018, issued by the Japan Patent Office dated Oct. 24, 2017.

(Continued)

*Primary Examiner* — Son T Le (57) ABSTRACT

Provided is a current sensor including a first Hall element and a second Hall element. Provided is a current sensor including a first Hall element; a second Hall element; a primary conductor arranged in a manner to have a current under measurement flow therethrough and to apply magnetic fields under measurement caused by the current under measurement, with different polarities, to the first Hall element and the second Hall element; and a secondary conductor arranged in a manner to have a reference current flow therethrough and to apply reference magnetic fields caused by the reference current, with the same polarity, to the first Hall element and the second Hall element.

10 Claims, 10 Drawing Sheets

(56) References Cited

U.S. PATENT DOCUMENTS

| | | | |
|---|---|---|---|
| 2010/0117638 A1 | 5/2010 | Yamashita | |
| 2012/0133356 A1 | 5/2012 | Charlier | |
| 2012/0153942 A1* | 6/2012 | van Veldhoven .. | G01R 33/0035 |
| | | | 324/239 |
| 2012/0274314 A1 | 11/2012 | Cesaretti | |
| 2013/0154631 A1 | 6/2013 | Tamura | |
| 2017/0234910 A1* | 8/2017 | Nakamura ......... | G01R 33/0029 |
| | | | 324/251 |

OTHER PUBLICATIONS

Written Opinion of the International Search Authorityfor for International Application No. PCT/JP2017/026018, issued the International Bureau of WIPO dated Oct. 24, 2017.

Extended European Search Report issued for counterpart European Application No. 17831026.4, issued by the European Patent Office dated Jun. 7, 2019.

International Preliminary Report on Patentability for International Application No. PCT/JP2017/026018, issued by the International Bureau of WIPO dated Jan. 22, 2019.

\* cited by examiner

CURRENT SENSOR

The contents of the following Japanese patent application (s) are incorporated herein by reference:
NO. 2016-144742 filed in JP on Jul. 22, 2016, and
PCT/JP2017/026018 filed on Jul. 19, 2017.

BACKGROUND

1. Technical Field

The present invention relates to a current sensor.

2. Related Art

Conventionally, it is known that in a current sensor including a first Hall element and a second Hall element, magnetic fields under measurement are applied to the first Hall element and the second Hall element by a current under measurement flowing through a primary conductor, as shown in Patent Document 1, for example.
Patent Document 1: Japanese Unexamined Patent Application Publication (Translation of PCT Application) No. 2014-517919

However, the conventional current sensor applies the magnetic fields under measurement with the same polarity to the first Hall element and the second Hall element. Therefore, it is impossible to cancel out the component corresponding to the current under measurement and the offset component using a simple calculation.

SUMMARY

According to a first aspect of the present invention, provided is a current sensor comprising a first Hall element; a second Hall element connected in parallel to the first Hall element; a primary conductor arranged in a manner to have a current under measurement flow therethrough and to apply magnetic fields under measurement caused by the current under measurement, with different polarities, to the first Hall element and the second Hall element; and a secondary conductor arranged in a manner to have a reference current flow therethrough and to apply reference magnetic fields caused by the reference current, with the same polarity, to the first Hall element and the second Hall element.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
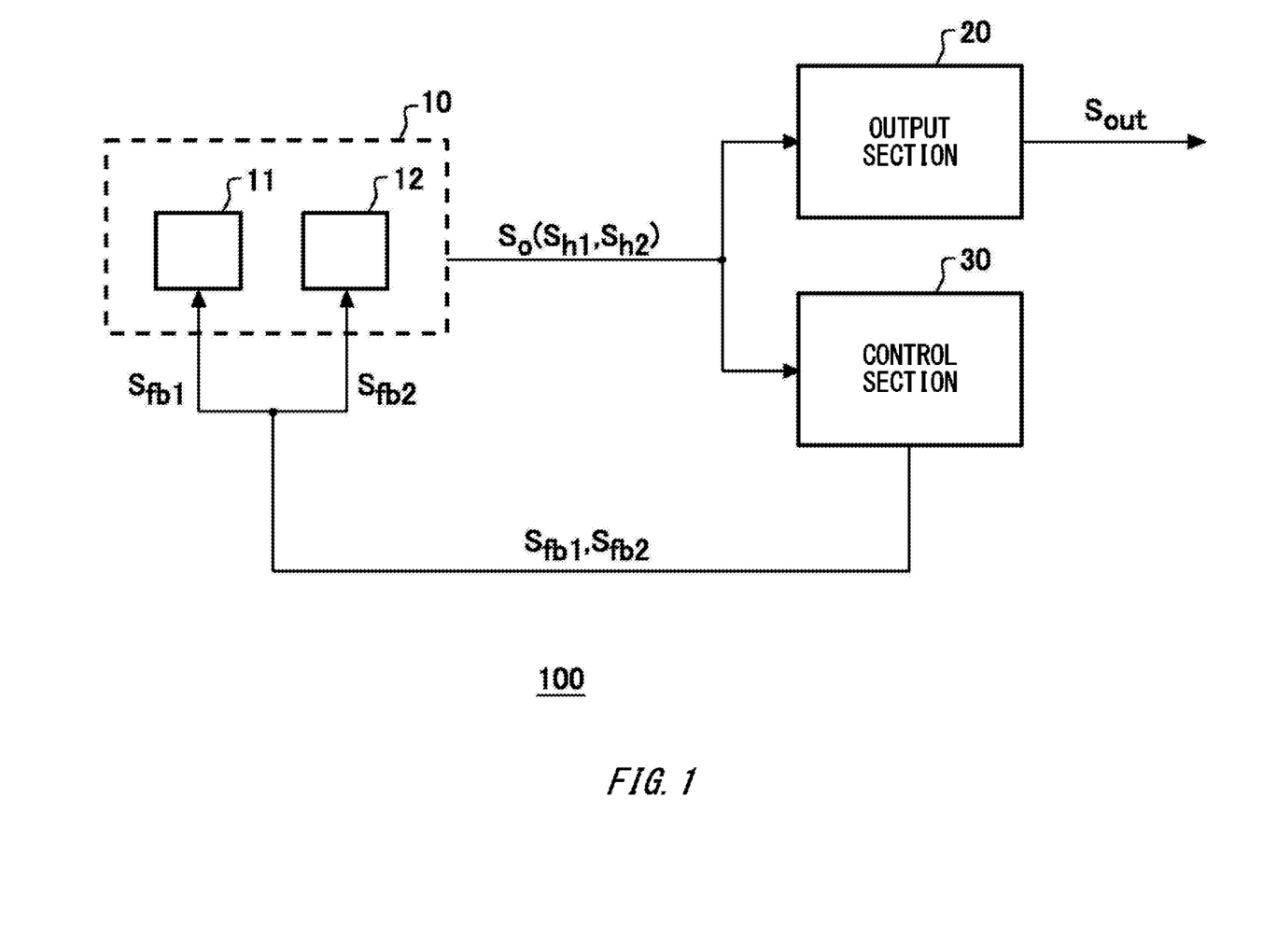
FIG. 1 shows an overview of a configuration of a current sensor 100.

FIG. 1 shows an overview of a configuration of a current sensor 100. The current sensor 100 of this example includes a magnetic element 10, an output section 20, and a control section 30. The magnetic element 10 includes a Hall element 11 and a Hall element 12.

The magnetic element 10 detects a current under measurement $I_o$ by detecting change of a magnetic field. The magnetic element 10 of this example detects the current under measurement $I_o$ according to the change in a magnetic field under measurement $B_{in}$ caused by the current under measurement $I_o$ flowing near the magnetic element 10. In one example, the magnetic element 10 includes a Hall element. The magnetic element 10 generates an output signal $S_o$ based on the change of the magnetic field under measurement $B_{in}$ caused by the current under measurement $I_o$. As an example, the output signal $S_o$ corresponds to a Hall electromotive signal from the Hall element. A driving method used in a case where the magnetic element 10 includes a Hall element may be constant current driving or constant voltage driving.

The Hall element 11 and the Hall element 12 are connected to each other in parallel. The Hall element 11 and the Hall element 12 of this example each output a differential signal corresponding to the magnetic field under measurement $B_{in}$. For example, the Hall element 11 and the Hall element 12 respectively output signals $S_{h1}$ and $S_{h2}$ as the differential signals. In other words, the output signals $S_{h1}$ and $S_{h2}$ are contained in the output signal $S_o$ of the magnetic element 10.

The output section 20 generates an output signal $S_{out}$ of the current sensor 100 based on the output signal $S_o$ of the magnetic element 10. The output section 20 outputs the output signal $S_{out}$ as the signal corresponding to the current under measurement $I_o$. For example, the output section 20 outputs the output signal $S_{out}$ obtained by removing the offset component from the output signal $S_o$.

The control section 30 controls the operation of the magnetic element 10, according to the output signal $S_o$ of the magnetic element 10. Furthermore, the control section 30 controls the driving of the Hall element 11 and the Hall element 12 separately. More specifically, the control section 30 controls the drive current of the Hall element 11 based on the output signal $S_o$. Furthermore, the control section 30 controls the drive current of the Hall element 12 based on the output signal $S_o$, separately from the control of the drive current of the Hall element 11.

In this Specification, controlling the drive current of the Hall element 12 separately from the control of the drive current of the Hall element 11 refers to separately controlling the drive currents of the Hall element 11 and the Hall element 12 by time-division operations or feedback circuits of different systems, based on the output signal $S_o$ containing both of the output signals $S_{h1}$ and $S_{h2}$. For example, the control section 30 of this example generates a feedback signal $S_{fb1}$ for controlling the Hall element 11, based on the output signals $S_{h1}$ and $S_{h2}$ of the Hall element 11 and the Hall element 12. Furthermore, the control section 30 generates a feedback signal $S_{fb2}$ for controlling the Hall element 12, based on the output signal $S_o$. The feedback signal $S_{fb1}$ and the feedback signal $S_{fb2}$ are respectively generated by different systems, or are generated in a time-division manner.

First Embodiment Example

Figure 2:
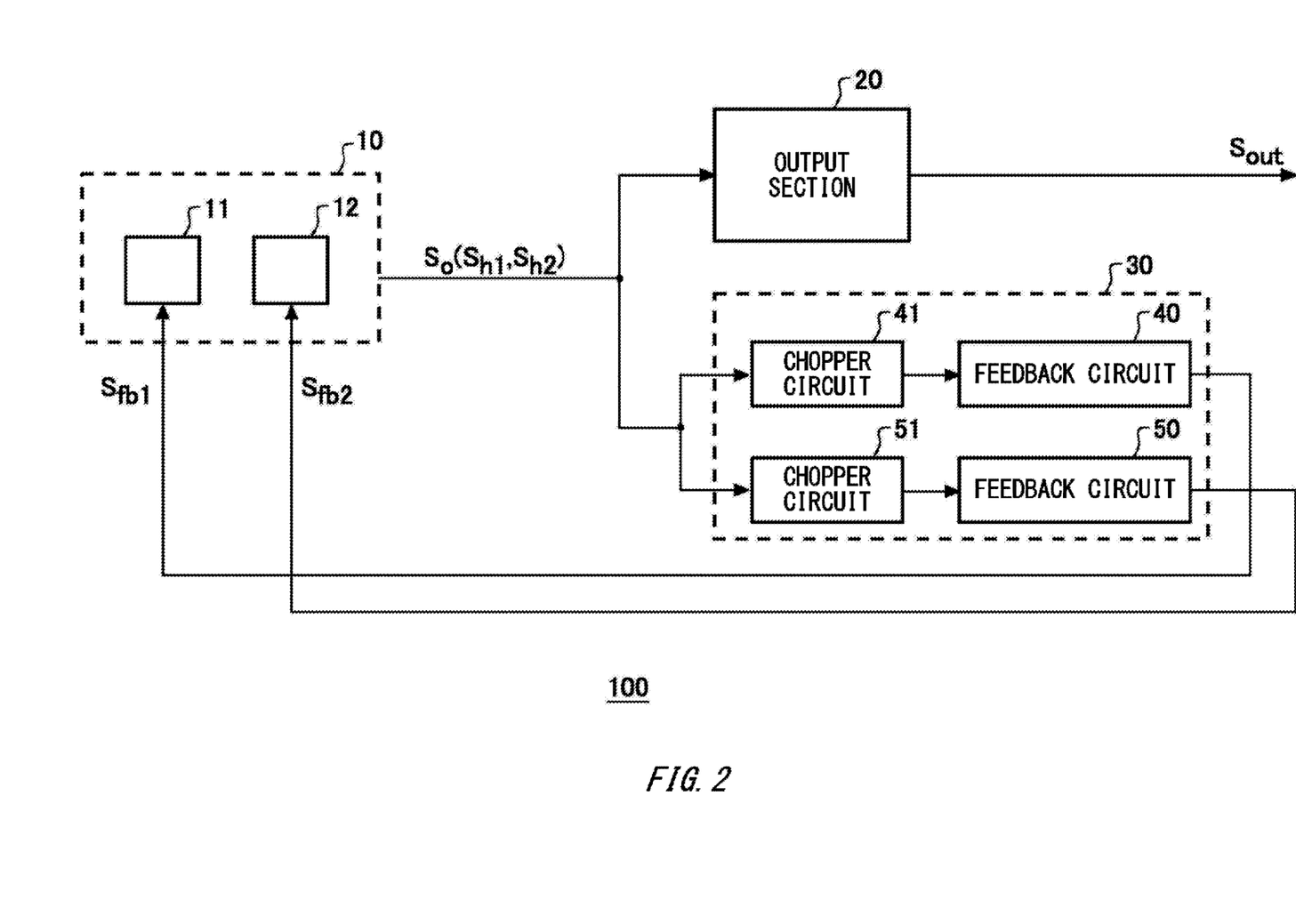
FIG. 2 shows an exemplary configuration of the current sensor 100 according to the first embodiment example.

FIG. 2 shows an exemplary configuration of the current sensor 100 according to a first embodiment example. The control section 30 of this example includes a feedback circuit 40, a chopper circuit 41, a feedback circuit 50, and a chopper circuit 51. The current sensor 100 of this example is an example of the current sensor 100 including a control section 30 having two systems.

The feedback circuit 40 and the feedback circuit 50 may be provided in parallel in the control section 30. The output signal $S_o$ is input to each of the feedback circuit 40 and the feedback circuit 50. In other words, the feedback circuit 40 and the feedback circuit 50 each have both of the output signals $S_{h1}$ and $S_{h2}$ of the Hall element 11 and the Hall element 12 input thereto. The feedback circuit 40 and the feedback circuit 50 of this example respectively control the driving of the Hall element 11 and the Hall element 12 separately, based on the output signal $S_o$. In this Specification, a current sensor 100 in which the driving of the Hall element 11 and the driving of the Hall element 12 are controlled by separate systems, based on the output signal $S_o$, is referred to as a two-system current sensor 100.

The feedback circuit 40 controls the drive current of the Hall element 11 based on the output signals $S_{h1}$ and $S_{h2}$ from the Hall element 11 and the Hall element 12. In one example, the feedback circuit 40 generates the feedback signal $S_{fb1}$ for controlling the driving of the Hall element 11, based on the output signal $S_o$. The feedback circuit 40 of this example inputs the generated feedback signal $S_{fb1}$ to the Hall element 11. For example, the feedback signal $S_{fb1}$ is a drive current for controlling the drive of the Hall element 11.

The feedback circuit 50 controls the drive current of the Hall element 12 based on the output signals $S_{h1}$ and $S_{h2}$ from the Hall element 11 and the Hall element 12. In one example, the feedback circuit 50 generates the feedback signal $S_{fb2}$ for controlling the drive of the Hall element 12, based on the output signal $S_o$. The feedback circuit 50 of this example inputs the generated feedback signal $S_{fb2}$ to the Hall element 12. For example, the feedback signal $S_{fb2}$ is a drive current for controlling the drive of the Hall element 12.

The chopper circuit 41 is provided between the feedback circuit 40 and the magnetic element 10. The chopper circuit 41 switches the polarity of either one of the output signal $S_{h1}$ and the output signal $S_{h2}$ included in the output signal $S_o$. For example, in a case where the chopper circuit 41 switches the signal polarity of the output signal $S_{h2}$, the chopper circuit 41 repeats the switching with a predetermined frequency. In other words, in this Specification, a case of switching the polarity refers to a case of swapping the polarity. On the other hand, a case where the polarity is not switched refers to a case where the polarity is not be replaced. The chopper circuit 41 is an example of a first chopper circuit.

The chopper circuit 51 is provided between the feedback circuit 50 and the magnetic element 10. The chopper circuit 51 switches the polarity of either one of the output signal $S_{h1}$ and the output signal $S_{h2}$ included in the output signal $S_o$. The chopper circuit 51 of this example switches the polarity of a signal differing from the signal whose polarity is switched by the chopper circuit 41. For example, in a case where the chopper circuit 41 switches the polarity of the output signal $S_{h2}$, the chopper circuit 51 switches the polarity of the output signal $S_{h1}$. Furthermore, in a case where the chopper circuit 41 switches the polarity of the output signal $S_{h1}$, the chopper circuit 51 may switch the polarity of the output signal $S_{h2}$. The chopper circuit 51 is an example of a second chopper circuit.

Figure 3:
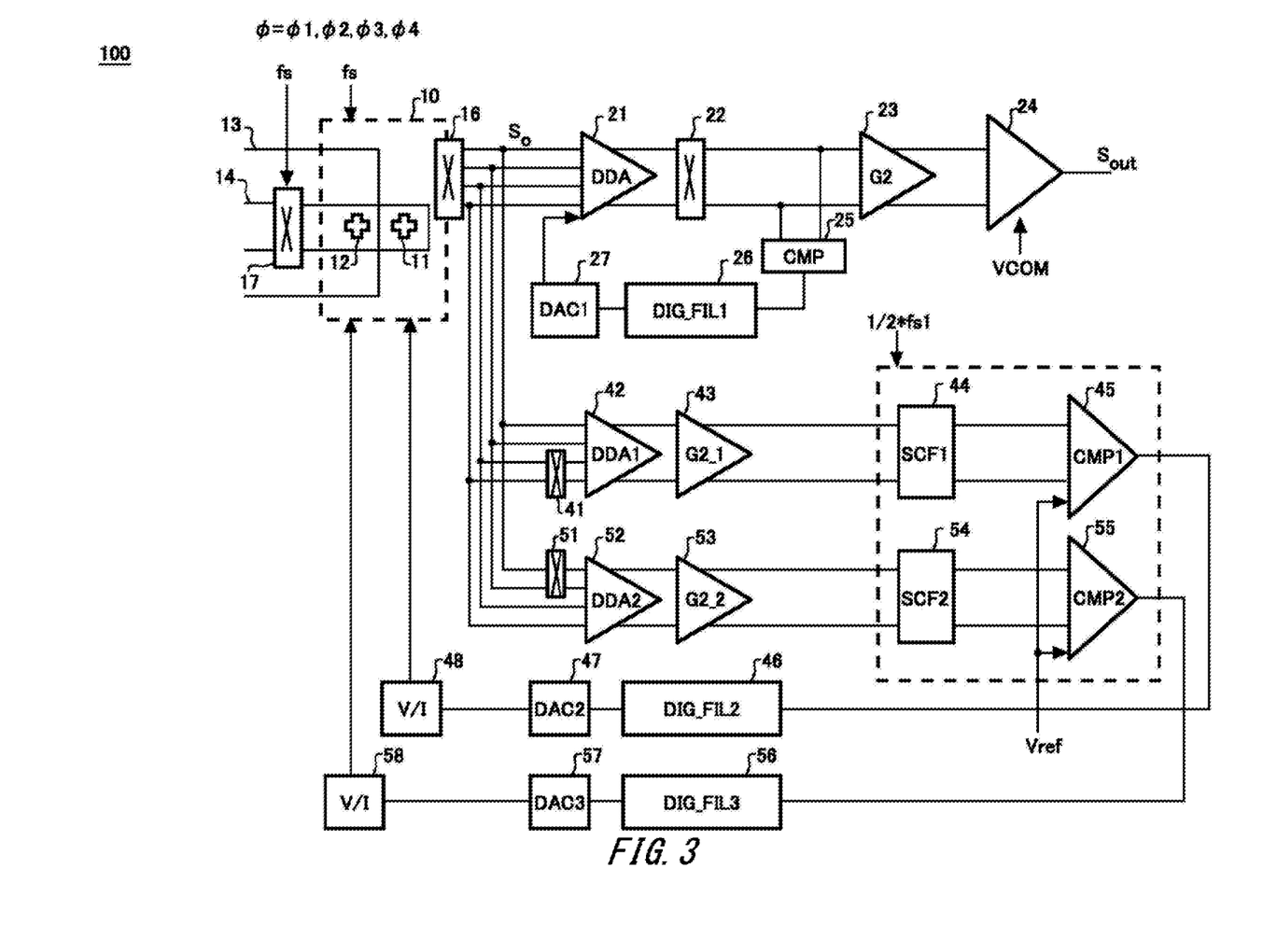
FIG. 3 shows an exemplary detailed configuration of the current sensor 100 according to the first embodiment example.

FIG. 3 shows a detailed exemplary configuration of the current sensor 100 according to the first embodiment example. This exemplary configuration is an example of the current sensor 100 according to the first embodiment example, but the current sensor 100 may be formed having another configuration.

The primary conductor 13 is arranged in a manner to have the current under measurement $I_o$ flow therethrough and to apply the magnetic field under measurement $B_{in}$ caused by the current under measurement $I_o$ to the magnetic element 10. The primary conductor 13 of this example is provided in a manner to apply magnetic fields under measurement $B_{in}$ caused by the current under measurement with different polarities, to the Hall element 11 and the Hall element 12. In this specification, applying magnetic fields with different polarities refers to applying to the Hall element 12 a magnetic field whose orientation is opposite the orientation of the magnetic field applied to the Hall element 11. The magnitudes of the magnetic fields applied to the Hall element 11 and the Hall element 12 may be the same, or may be different. Detailed structures of the Hall elements 11 and 12 and the primary conductor 13 are described using FIG. 8.

The switch circuit 16 causes the magnetic element 10 to perform a spinning current operation, according to a drive signal having a spinning current frequency $f_s$. During the spinning current operation, the switch circuit 16 outputs output voltages of the Hall element 11 and the Hall element 12 according to the direction of the drive current. The switch circuit 16 of this example changes the orientation of the drive current of the magnetic element 10 with the spinning current frequency $f_s$. For example, the switch circuit 16 switches the orientation of the each of the drive currents input to the Hall element 11 and the Hall element 12, with to the spinning current frequency $f_s$. In this way, the switch circuit 16 outputs the magnetic field under measurement $B_{in}$ as an AC component.

The secondary conductor 14 is arranged in a manner to have a reference current $I_{ref}$ flow therethrough and to apply a reference magnetic field $B_{ref}$ caused by the reference current $I_{ref}$ to the magnetic element 10. The secondary conductor 14 of this example is arranged to apply reference magnetic fields $B_{ref}$ with the same polarity to the Hall element 11 and the Hall element 12. In this Specification, applying the magnetic fields with the same polarity refers to applying to the Hall element 12 a magnetic field whose orientation is the same as the orientation of the magnetic field applied to the Hall element 11.

The switch circuit 17 switches the direction of the reference current $I_{ref}$ flowing through the secondary conductor 14. For example, the switch circuit 17 switches the direction of the reference current $I_{ref}$ with to the spinning current frequency $f_s$. In this way, the orientations of the reference magnetic fields $B_{ref}$ applied with the same polarity to the Hall element 11 and the Hall element 12 are switched with the spinning current frequency $f_s$.

The output section 20 includes a subtracting section 21 (DDA), a demodulating section 22, an amplifying section 23, a filter section 24, a comparator 25 (CMP), a filter section 26 (DIG_FIL1), and a DA converting section 27 (DAC1).

The subtracting section 21 outputs a subtraction result between the output signal $S_{h1}$ and the output signal $S_{h2}$. Here, in this example, the magnetic field under measurement $B_{in}$ components are applied with different polarities, and the reference magnetic field $B_{ref}$ components are applied with the same polarities. Therefore, the subtracting section 21 removes the reference magnetic field $B_{ref}$ components applied with the same polarities by subtraction between the output signal $S_{h1}$ and the output signal $S_{h2}$. When the reference magnetic field $B_{ref}$ components are removed, only the magnetic field under measurement $B_{in}$ components remain. In this way, the subtracting section 21 extracts only the magnetic field under measurement $B_{in}$ components.

The demodulating section 22 demodulates the magnetic field under measurement $B_{in}$ components, which are AC components, into DC components. For example, the magnetic field under measurement $B_{in}$ components are demodulated into a base band. By demodulating the magnetic field under measurement $B_{in}$ components, the noise components on the high-frequency side are removed by a filter circuit provided downstream.

The amplifying section 23 amplifies the magnetic field under measurement $B_{in}$ components that have been demodulated. For example, the amplifying section 23 amplifies the Hall electromotive signal of the magnetic element 10 generated by the magnetic field under measurement $B_{in}$. The remaining offset component and the offset component generated by the amplifying section 23 may be corrected by the amplifying section 23.

The filter section 24 includes a low-pass filter (LPF). The filter section 24 removes the high-frequency region in the signal. In this way, the filter section 24 selects the base band component, and outputs this base band component as the sensor output signal $S_{out}$.

The comparator 25 outputs a comparison result, based on the differential signal output by the demodulating section 22, to the filter section 26. As one example, the comparator 25 binarizes and outputs the comparison result corresponding to the difference between the differential signals. The filter section 26 includes an LPF, and performs a digital filtering process on the comparison result input thereto. Furthermore, the DA converting section 27 converts the digital signal output by the filter section 26 into an analog signal, and outputs this analog signal to the subtracting section 21. In this way, the subtracting section 21 removes the offset component from the output signal $S_o$.

The feedback circuit 40 includes an adding section 42 (DDA1), an amplifying section 43 (G2_1), a calculating section 44 (SCF1), a comparing section 45 (CMP1), a filter section 46 (DIG_FIL2), a DA converting section 47 (DAC2), and a VI converting section 48. In this way, the feedback circuit 40 corrects the sensitivity of the Hall element 11, based on the output signals $S_{h1}$ and $S_{h2}$ of the Hall element 11 and the Hall element 12.

The adding section 42 adds together the output signal $S_{h1}$ and the output signal $S_{h2}$. The chopper circuit 41 of this example is provided between the feedback circuit 40 and the Hall element 12. In this way, the output signal $S_{h2}$ whose polarity has been switched and the output signal $S_{h1}$ whose polarity has not been switched are input to the adding section 42. The amplifying section 43 amplifies the result of the addition, and outputs the amplified result to the calculating section 44.

The calculating section 44 performs a predetermined calculation according to the signal input at each of the phases φ1 to φ4. The calculating section 44 outputs the calculation result to the comparing section 45. The comparing section 45 outputs, to the filter section 46, a comparison result corresponding to the calculation result output by the calculating section 44. The comparing section 45 may output the comparison result as a digital signal.

The filter section 46 performs a filtering process with the LPF on the digital signal input thereto. The DA converting section 47 converts the digital signal output by the filter section 46 into an analog signal. The VI converting section 48 generates a drive current for driving the Hall element 11, according to the analog signal output by the DA converting section 47. In this way, the feedback circuit 40 adjusts the drive current of the Hall element 11, according to the output signal $S_{h1}$ output by the Hall element 11. Accordingly, the feedback circuit 40 can correct the sensitivity of the Hall element 11.

The feedback circuit 50 includes an adding section 52 (DDA2), an amplifying section 53 (G2_2), a calculating section 54 (SCF2), a comparing section 55 (CMP2), a filter section 56 (DIG_FIL3), a DA converting section 57 (DAC3), and a VI converting section 58. In this way, the feedback circuit 50 corrects the sensitivity of the Hall element 12, based on the output signals $S_{h1}$ and $S_{h2}$ of the Hall element 11 and the Hall element 12.

The adding section 52 adds together the output signal $S_{h1}$ and the output signal $S_{h2}$. The chopper circuit 51 of this example is provided between the feedback circuit 50 and the Hall element 11. In this way, the output signal $S_{h1}$ whose polarity has been switched and the output signal $S_{h2}$ whose polarity has not been switched are input to the adding section 52. The amplifying section 53 amplifies the result of the addition, and outputs the amplified result to the calculating section 54.

The calculating section 54 performs a predetermined calculation according to the signal input at each of the phases φ1 to φ4. The calculating section 54 outputs the calculation result to the comparing section 55. The comparing section 55 outputs, to the filter section 56, a result of a comparison performed based on the calculation result output by the calculating section 54. The comparing section 55 may output the comparison result as a digital signal.

The filter section 56 performs a filtering process with the LPF on the digital signal input thereto. The DA converting section 57 converts the digital signal output by the filter section 56 into an analog signal. The VI converting section 58 generates a drive current for driving the Hall element 12, according to the analog signal output by the DA converting section 57. In this way, the feedback circuit 50 adjusts the drive current of the Hall element 12, according to the output signal $S_{h2}$ output by the Hall element 12. Accordingly, the feedback circuit 50 can correct the sensitivity of the Hall element 12.

Figure 4:
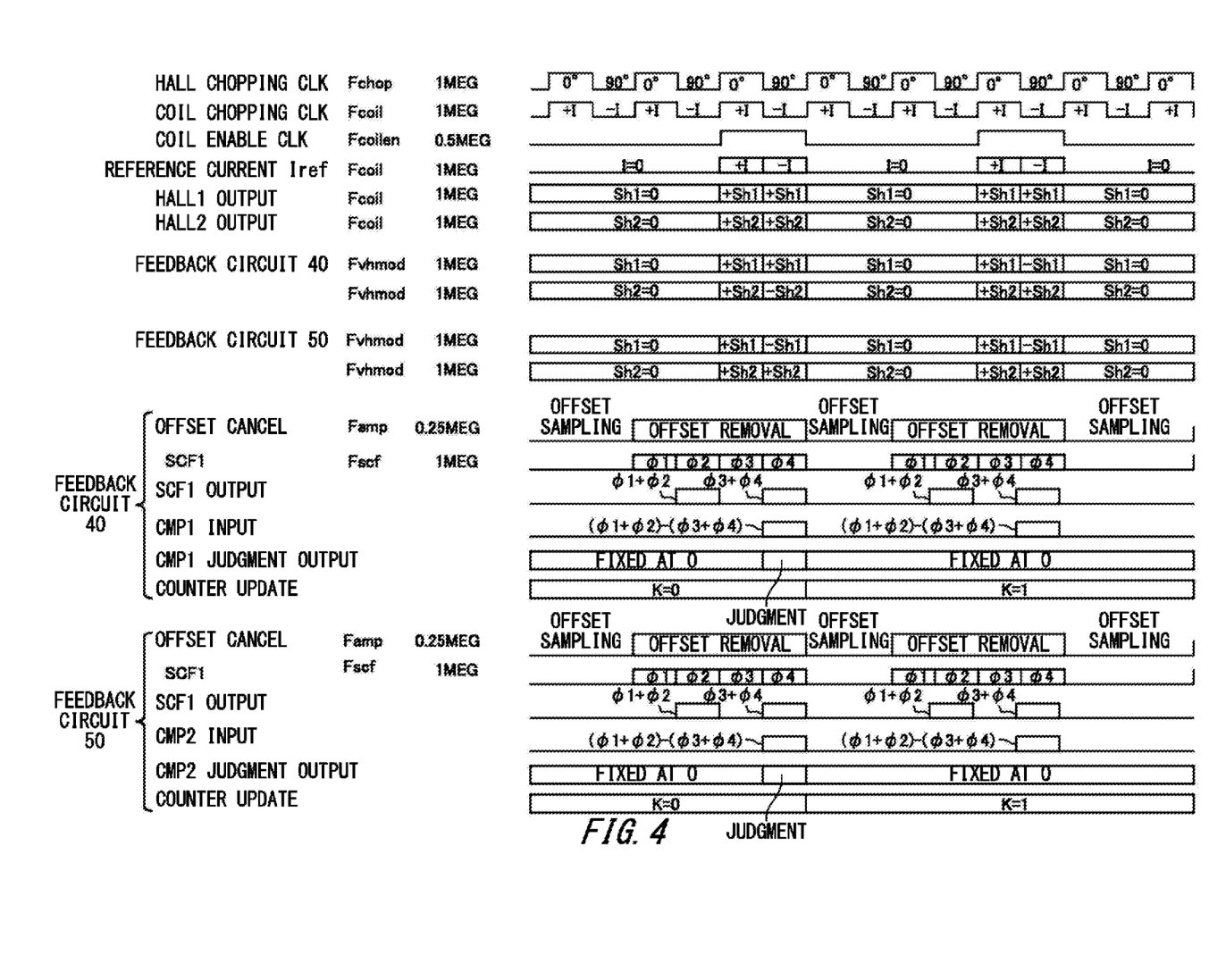
FIG. 4 shows an exemplary timing chart of the current sensor 100 according to the first embodiment example.

FIG. 4 shows an exemplary timing chart of the current sensor 100 according to the first embodiment example. This example describes an offset removal method in a case where only the reference current $I_{ref}$ is considered. In other words, in the present example, the effect of the current under measurement $I_o$ is not considered.

The HALL CHOPPING CLK is a signal controlling the drive state of the magnetic element 10. The driving of the magnetic element 10 is switched between 0° and 90° according to the spinning current frequency $f_s$. Between 0° and 90°, the direction of the drive current flowing through the magnetic element 10 is switched to differ by 90°. More specifically, the direction of the drive current flowing through the Hall element 11 in the case of 0° and the direction of the drive current flowing through the Hall element 11 in the case of 90° differ by 90°. The same is true for the Hall element 12. In other words, the Hall element 11 and the Hall element 12 of the present example each operate in a spinning current manner. The Hall element 11 and the Hall element 12 can cancel out the offset by performing the spinning current operation. The frequency Fchop of the HALL CHOPPING CLK in this example is 1 MEG[Hz]. The frequency Fchop is an example of the spinning current frequency $f_s$.

The COIL CHOPPING CLK is a signal controlling the direction of the reference current $I_{ref}$ flowing through the secondary conductor 14. The COIL CHOPPING CLK of this example controls the direction of the reference current $I_{ref}$ to be +I or −I. For +I and −I, the reference current $I_{ref}$ flows in opposite directions. In other words, magnetic fields with different polarities are applied to the Hall element 11 and the Hall element 12 for +I and for −I. Here, the frequency of the COIL CHOPPING CLK may be the same as the frequency of the HALL CHOPPING CLK. Furthermore, the COIL CHOPPING CLK may have the same phase as the HALL CHOPPING CLK. The frequency Fcoil of the COIL CHOPPING CLK of this example is 1 MEG[Hz].

The COIL ENABLE CLK switches whether the reference current $I_{ref}$ flows to the secondary conductor 14. When the COIL ENABLE CLK is high, the reference magnetic field $B_{ref}$ corresponding to the reference current $I_{ref}$ is applied to the magnetic element 10. For example, when the COIL ENABLE CLK is high, the +I or −I reference current $I_{ref}$ flows according to the COIL CHOPPING CLK. On the other hand, when the COIL ENABLE CLK is low, the reference magnetic field $B_{ref}$ corresponding to the reference current $I_{ref}$ is not applied to the magnetic element 10. In other words, I=0 when the COIL ENABLE CLK is low. The frequency Fcoilen of the COIL ENABLE CLK of this example is 0.5 MEG[Hz].

The HALL1 OUTPUT indicates the output signal $S_{h1}$ of the Hall element 11. The HALL2 OUTPUT indicates the output signal $S_{h2}$ of the Hall element 12.

When the reference current $I_{ref}$ is 0, there is no output from the Hall element 11, and the output signal $S_{h1}=0$. Similarly, when the reference current $I_{ref}$ is 0, there is no component derived from the reference magnetic field $B_{ref}$ in the output of the Hall element 12, and the output signal $S_{h2}=0$.

On the other hand, when the reference current $I_{ref}$ is +I or −I, the reference magnetic field $B_{ref}$ has the same polarity for each of the Hall element 11 and the Hall element 12, and therefore the output signals $S_{h1}$ and $S_{h2}$ of the Hall element 11 and the Hall element 12 are both positive. In other words, the components derived from the reference magnetic field $B_{ref}$ in the output signals of the Hall element 11 and the Hall element 12 are $+S_{h1}$ and $+S_{h2}$.

Here, the input to the feedback circuit 40 is $+S_{h1}$ and $+S_{h2}$ when the HALL CHOPPING CLK is 0°. On the other hand, the input to the feedback circuit 40 is $+S_{h1}$ and $-S_{h2}$ when the HALL CHOPPING CLK is 90°. It should be noted that whether the signs of the output signals are positive or negative may be altered as appropriate according to the arrangement of the chopper circuit 41.

Furthermore, the input to the feedback circuit 50 is $+S_{h1}$ and $+S_{h2}$ when the HALL CHOPPING CLK is 0°. On the other hand, the input to the feedback circuit 50 is $-S_{h1}$ and $+S_{h2}$ when the HALL CHOPPING CLK is 90°. It should be noted that whether the signs of the output signals are positive or negative may be altered as appropriate according to the arrangement of the chopper circuit 51.

Here, the feedback circuit 40 removes the offset of the Hall element 11 according to the calculation using the calculating section 44. The calculating section 44 removes the offset based on the output signals at the phases φ1, φ2, φ3, and φ4 for removing the offset. The feedback circuit 40 provides an offset removal period for cancelling out the offset with a suitable period, for an offset sampling interval for sampling the output signal. The offset removal period may be suitably provided according to the desired detection accuracy, power consumption, and the like. The offset removal interval of this example is set to be 0.25 MEG[Hz], but the offset removal interim is not limited to this. The offset removal period may be set randomly in the offset sampling period. At the phases φ1, φ2, φ3, and φ4, the output signal is respectively $S_{h1}=0$, $S_{h2}=0$, $S_{h1}+S_{h2}$, and $S_{h1}-S_{h2}$. The calculating section 44 of this example calculates φ1+φ2 and φ3+φ4. The calculating section 44 then calculates (φ1+φ2)−(φ3+φ4), according to the subtraction between φ1+φ2 and φ3+φ4. In other words, by calculating (φ1+φ2)−(φ3+φ4), the signal relating to the output signal $S_{h2}$ of the Hall element 12 is removed. In this way, it is possible to extract only the output signal $S_{h1}$ of the Hall element 11.

The calculating section 44 inputs the calculated difference (φ1+φ2)−(φ3+φ4) to the comparing section 45. The comparing section 45 may remove the offset of the comparing section using a clocked comparator. After this, the counter is updated according to the judgment result of the comparing section 45. In one example, the counter is K=3. In this case, the counter adds together K=0, 1, 2, and the setting value of the DA converting section 47 at the timing when K=3 (i.e. K=0) is updated.

The feedback circuit 40 of this example extracts only the signal based on the output signal $S_{h1}$ of the Hall element 11 from the output signal $S_o$. In this way, the feedback circuit 40 controls the sensitivity of the Hall element 11.

In a similar manner, the feedback circuit 50 removes the offset of the Hall element 12 according to the calculation using the calculating section 54. The calculating section 54 removes the offset based on the output signals at the phases φ1, φ2, φ3, and φ4. At the phases φ1, φ2, φ3, and φ4, the output signal is respectively $S_{h1}=0$, $S_{h2}=0$, $S_{h1}+S_{h2}$, and $-S_{h1}+S_{h2}$. The calculating section 54 of this example calculates φ1+φ2 and φ3+φ4. The calculating section 54 then calculates (φ1+φ2)−(φ3+φ4), according to the subtraction between φ1+φ2 and φ3+φ4. In other words, by calculating (φ1+φ2)−(φ3+φ4), the signal relating to the output signal $S_{h1}$ of the Hall element 11 is removed. In this way, it is possible to extract only the output signal $S_{h2}$ of the Hall element 12.

The calculating section 54 inputs the calculated difference (φ1+φ2)−(φ3+φ4) to the comparing section 55. After this, the counter is updated according to the judgment result of the comparing section 55. In one example, the counter is K=3. In this case, the counter adds together K=0, 1, 2, and the setting value of the DA converting section 57 at the timing when K=3 (i.e. K=0) is updated.

The feedback circuit 50 extracts only the signal based on the output signal $S_{h2}$ of the Hall element 12 from the output signal $S_o$. In this way, the feedback circuit 50 corrects the sensitivity of the Hall element 12.

In the manner described above, the current sensor 100 of this example independently controls the drive currents of the Hall element 11 and the Hall element 12 using the feedback circuit 40 and the feedback circuit 50 that are feedback circuits of different systems, based on the output signal $S_o$ including both of the output signals $S_{h1}$ and $S_{h2}$. Accordingly, even in a case where there is a sensitivity difference between the Hall element 11 and the Hall element 12, the current sensor 100 of this example can self-correct the sensitivity of the magnetic element 10 with high accuracy.

Second Embodiment Example

Figure 5:
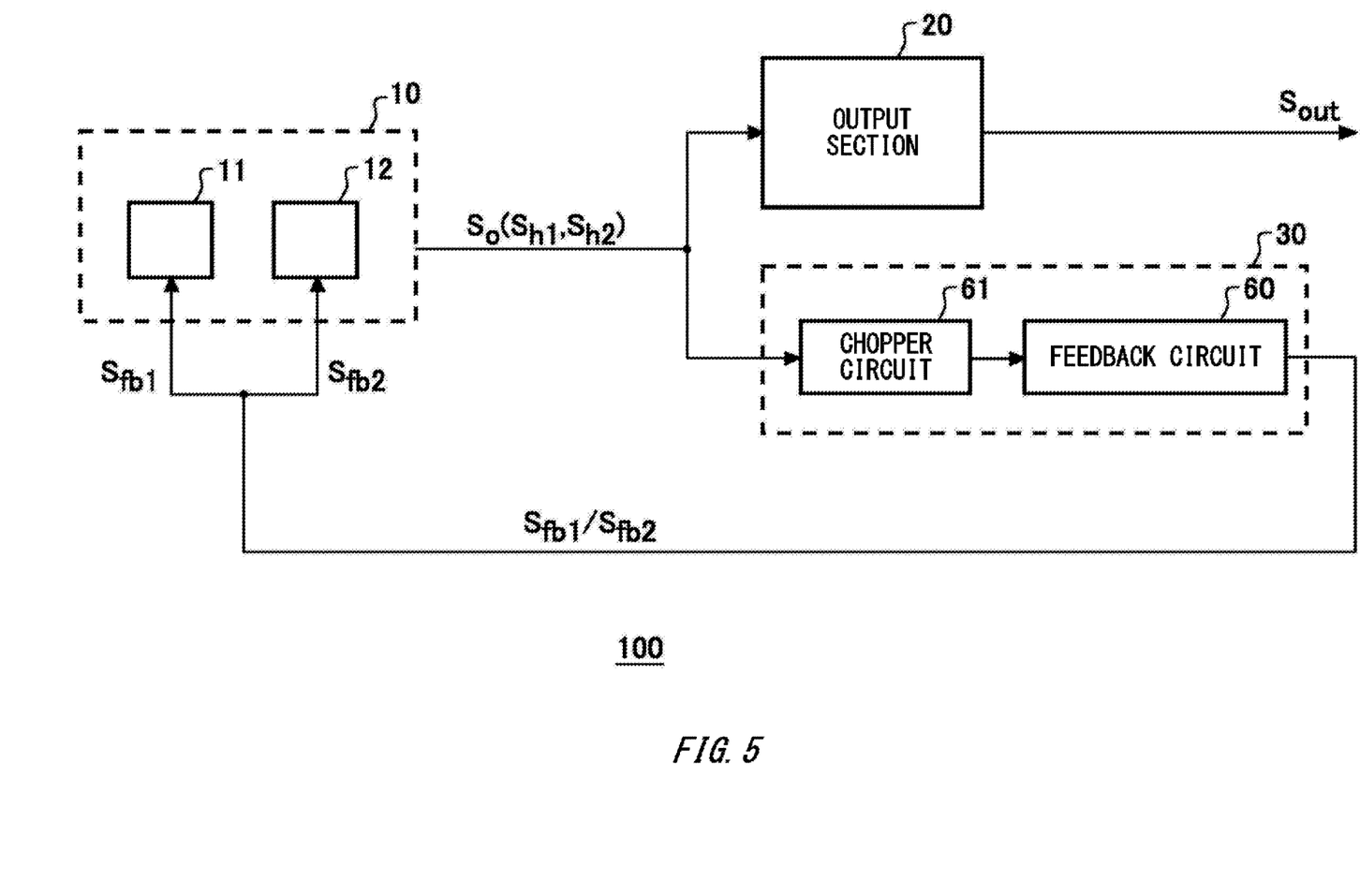
FIG. 5 shows an exemplary configuration of the current sensor 100 according to the second embodiment example.

FIG. 5 shows an exemplary configuration of a current sensor 100 according to a second embodiment example. The control section 30 of this example includes a feedback circuit 60. In other words, the current sensor 100 of this example is an example of a case where a one-system control section 30 is included. In this case, the control section 30 operates in a time-division manner.

The feedback circuit 60 performs time-division control of the driving of the Hall element 11 and the Hall element 12, based on the output signal $S_o$. More specifically, the feedback circuit 60 operates in a time-division manner to perform a first feedback operation for controlling the drive current of the Hall element 11 based on the output signals $S_{h1}$ and $S_{h2}$ of the Hall element 11 and the Hall element 12 and perform a second feedback operation for controlling the drive current of the Hall element 12 based on the output signals $S_{h1}$ and $S_{h2}$ of the Hall element 11 and the Hall element 12.

For example, the feedback circuit 60 generates the feedback signal $S_{fb1}$ and the feedback signal $S_{fb2}$ for controlling the Hall element 11 and the Hall element 12. The feedback circuit 60 of this example generates the feedback signal $S_{fb1}$ and the feedback signal $S_{fb2}$ in a time-division manner, and outputs these signals to each of the Hall element 11 and the Hall element 12.

The current sensor 100 of this example includes a one-system control section 30, and can correct the sensitivity of each of the Hall element 11 and the Hall element 12. In other words, the current sensor 100 of this example can make the circuit configuration simpler than in a case of a two-system control section 30 such as in the current sensor 100 according to the first embodiment example.

Figure 6A:
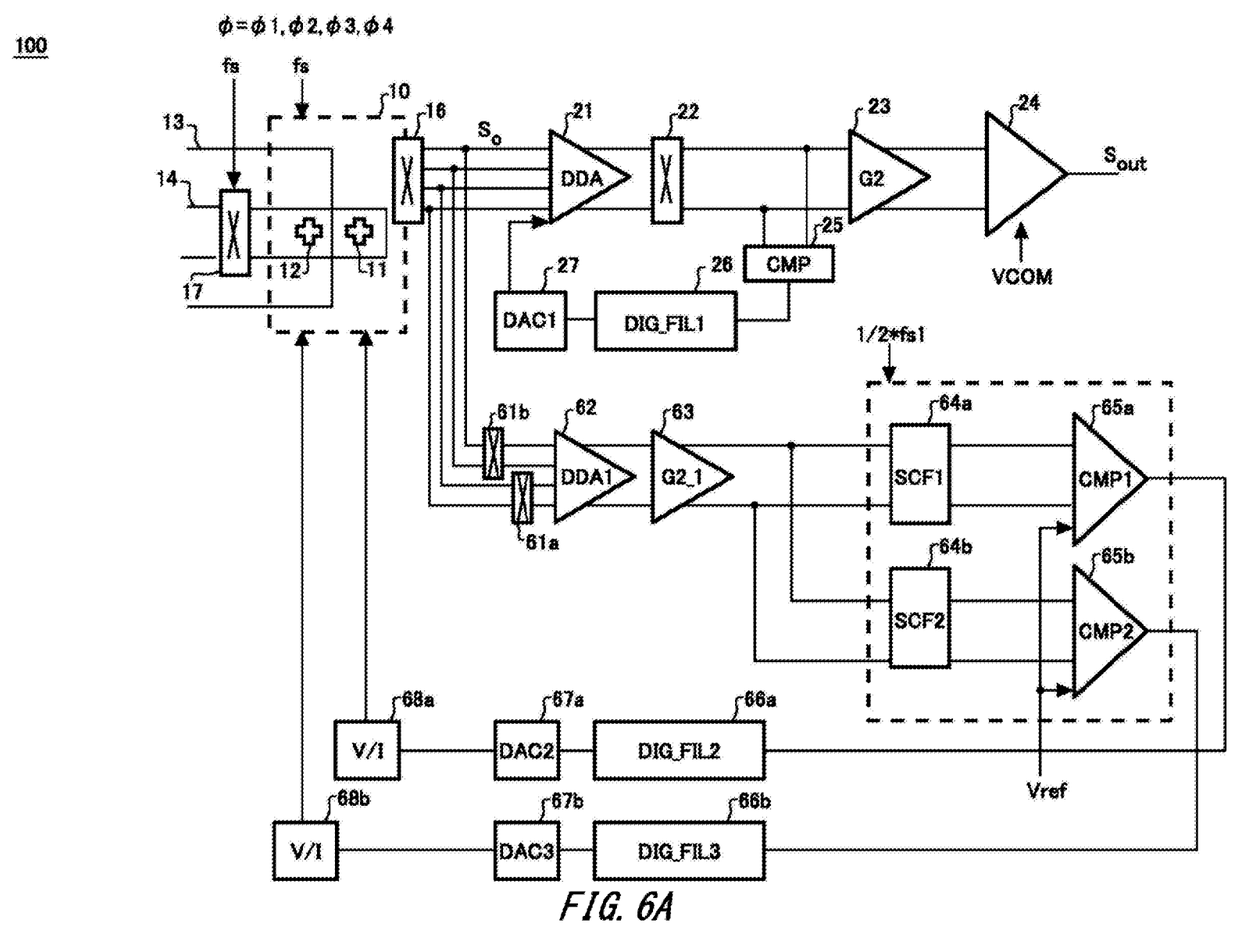
FIG. 6A shows an exemplary detailed configuration of the current sensor 100 according to the second embodiment example.

FIG. 6A shows a detailed exemplary configuration of the current sensor 100 according to the second embodiment example. The current sensor 100 of this example differs from the current sensor 100 according to the first embodiment example by repeating, in a time-division manner, a first feedback operation for correcting the sensitivity of the Hall element 11 and a second feedback operation for correcting the sensitivity of the Hall element 12. This exemplary configuration is one example of the current sensor 100 according to the second embodiment example, and the current sensor 100 may be formed according to another configuration.

The feedback circuit 60 includes an adding section 62, an amplifying section 63, calculating sections 64a and 64b, comparing sections 65a and 65b, filter sections 66a and 66b, DA converting sections 67a and 67b, and VI converting sections 68a and 68b. These circuit configurations basically function in a similar manner as each circuit configuration of the feedback circuit 40 and the feedback circuit 50. However, the feedback circuit 60 differs by operating with a single system in time division, in contrast to the feedback circuit 40 and the feedback circuit 50 operating with two systems. In this example, the description focuses mainly on points differing from the feedback circuit 40 and the feedback circuit 50.

The chopper circuit 61 switches the polarity of the output signal $S_o$. The chopper circuit 61 is provided between the magnetic element 10 and the adding section 62. The chopper circuit 61 of this example includes a chopper circuit 61a and a chopper circuit 61b.

The chopper circuit 61a switches the polarity of the output signal $S_{h2}$ of the Hall element 12. The chopper circuit 61a is provided between the feedback circuit 60 and the Hall element 12. The chopper circuit 61a outputs the output signal $S_{h2}$ whose polarity has been switched to the feedback circuit 60. The chopper circuit 61a is an example of a third chopper circuit.

The chopper circuit 61b switches the polarity of the output signal $S_{h1}$ of the Hall element 11. The chopper circuit 61b is provided between the feedback circuit 60 and the Hall element 11. The chopper circuit 61b outputs the output signal $S_{h1}$ whose polarity has been switched to the feedback circuit 60. The chopper circuit 61b is an example of a fourth chopper circuit.

Figure 6B:
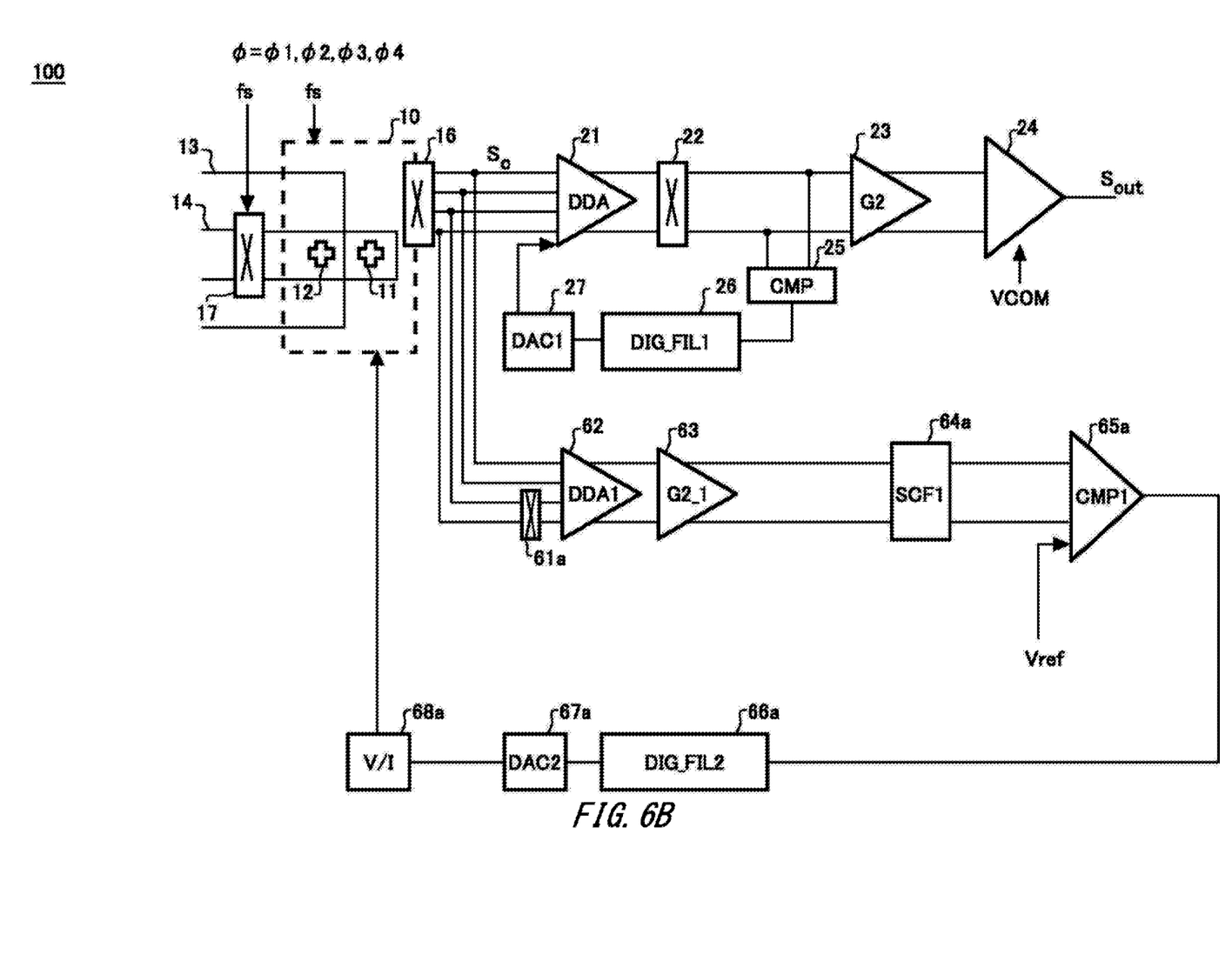
FIG. 6B shows an exemplary configuration during the first feedback operation of the current sensor 100 according to the second embodiment example.

FIG. 6B shows an exemplary configuration during the first feedback operation of the current sensor 100 according to the second embodiment example. In this drawing, only the configuration operating during the first feedback operation is shown.

During the first feedback operation, operation is performed using the chopper circuit 61a, the adding section 62, the amplifying section 63, the calculating section 64a, the comparing section 65a, the filter section 66a, the DA converting section 67a, and the VI converting section 68a according to the switching of switches. In this way, the feedback circuit 60 controls the driving of the Hall element 11. In this Specification, the control path used during the first feedback operation is referred to as control path 1.

Figure 6C:
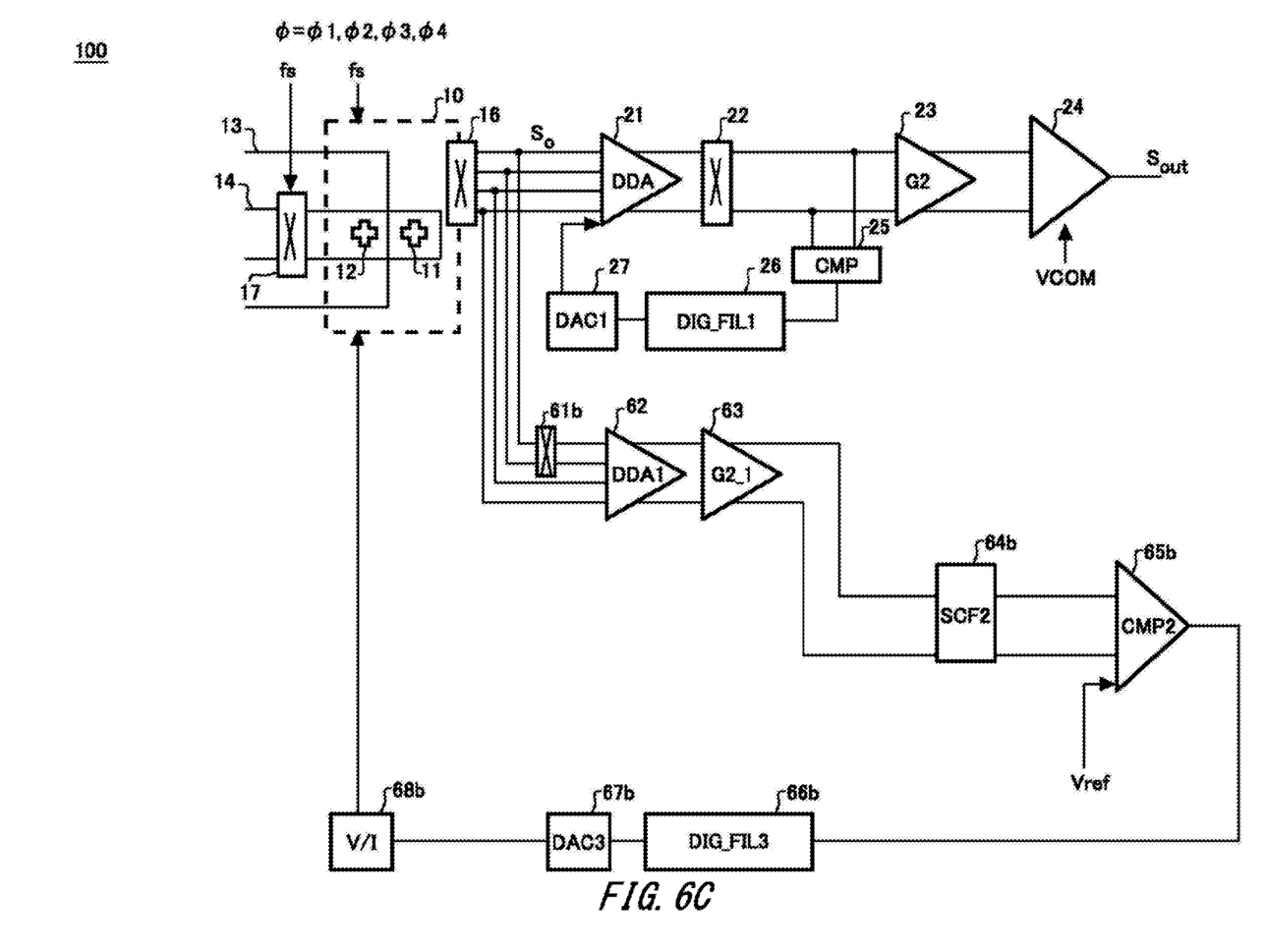
FIG. 6C shows an exemplary configuration during the second feedback operation of the current sensor 100 according to the second embodiment example.

FIG. 6C shows an exemplary configuration during the second feedback operation of the current sensor 100 according to the second embodiment example. In this drawing, only the configuration operating during the second feedback operation is shown.

During the second feedback operation, operation is performed using the chopper circuit 61b, the adding section 62, the amplifying section 63, the calculating section 64b, the comparing section 65b, the filter section 66b, the DA converting section 67b, and the VI converting section 68b according to the switching of switches. In this way, the feedback circuit 60 controls the driving of the Hall element 12. In this Specification, the control path used during the second feedback operation is referred to as control path 2.

In this way, the current sensor 100 of this example switches between the first feedback operation and the second feedback operation in a time-division manner, by switching the circuit configuration using switches. In this way, the current sensor 100 independently controls the drive currents of the Hall element 11 and the Hall element 12 in a time-division manner.

Figure 7:
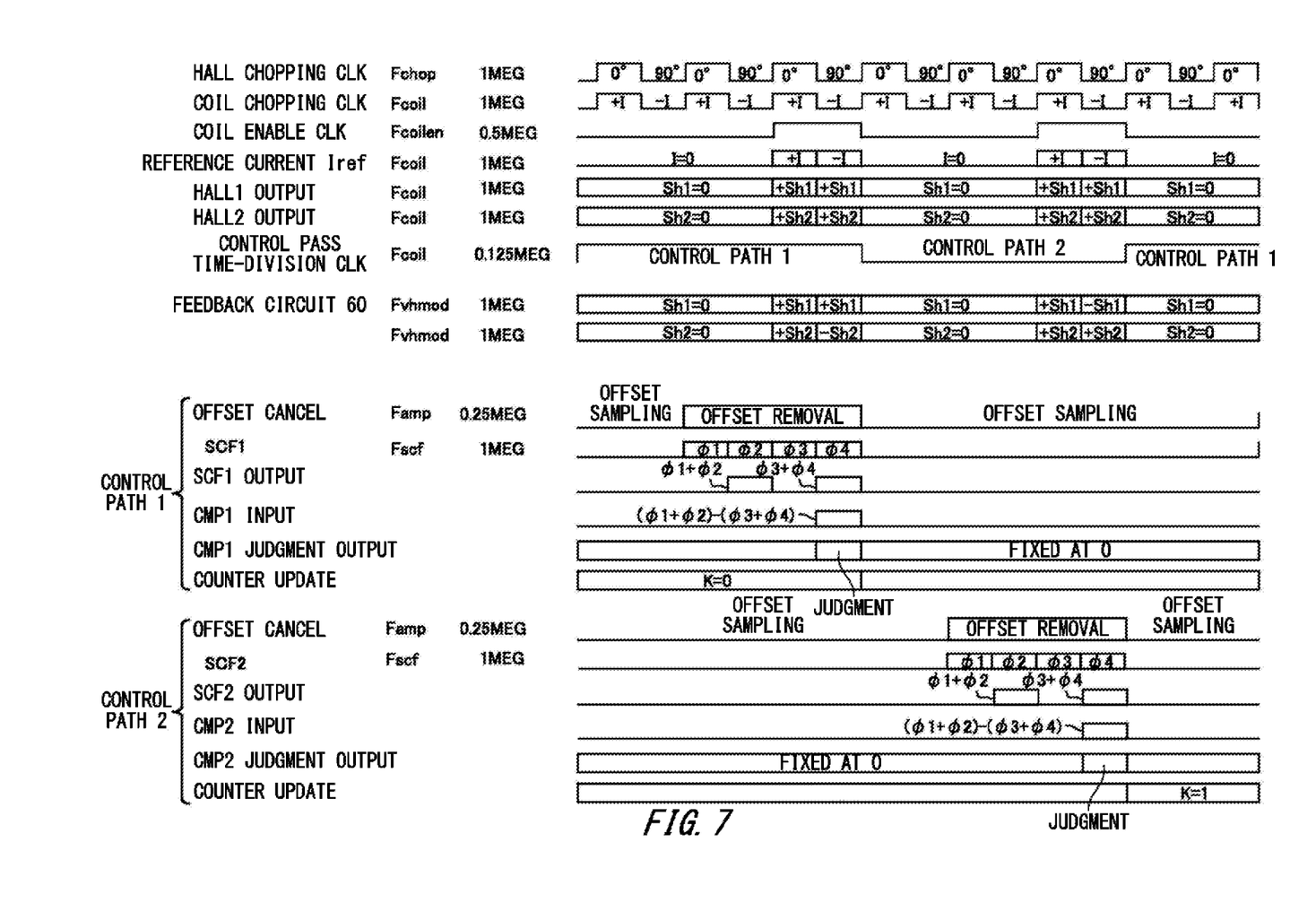
FIG. 7 shows an exemplary timing chart of the current sensor 100 according to the second embodiment example.

FIG. 7 shows an exemplary timing chart of the current sensor 100 according to the second embodiment. This example describes an offset removal method in a case where only the reference current $I_{ref}$ is considered. In other words, in this example, the effect of the current under measurement $I_o$ is not considered. Furthermore, in this drawing, points differing from those of the timing chart of the current sensor 100 according to the first embodiment example shown in FIG. 4 in particular are described.

The CONTROL PATH TIME-DIVISION CLK switches the timing of the time-division operation of the current sensor 100. The CONTROL PATH TIME-DIVISION CLK of this example switches, in a time-division manner, between control path 1 for performing the first feedback operation and control path 2 for performing the second feedback operation. The CONTROL PATH TIME-DIVISION CLK operates with a frequency of 0.125 MEG[Hz].

In control path 1, the input to the feedback circuit 60 is $+S_{h1}$ and $+S_{h2}$ when the HALL CHOPPING CLK is 0°. On the other hand, in control path 1, the input to the feedback circuit 60 is $+S_{h1}$ and $-S_{h2}$ when the HALL CHOPPING CLK is 90°. It should be noted that whether the signs of the output signals are positive or negative may be altered as appropriate according to the arrangement of the chopper circuit 61a.

In control path 2, the input to the feedback circuit 60 is $+S_{h1}$ and $+S_{h2}$ when the HALL CHOPPING CLK is 0°. On the other hand, in control path 2, the input to the feedback circuit 60 is $-S_{h1}$ and $+S_{h2}$ when the HALL CHOPPING CLK is 90°. It should be noted that whether the signs of the output signals are positive or negative may be altered as appropriate according to the arrangement of the chopper circuit 61b.

Here, in control path 1, the feedback circuit 60 removes the offset of the Hall element 11 according to the calculation using the calculating section 64a. The calculating section 64a removes the offset based on the output signals at the phases φ1, φ2, φ3, and φ4. At the phases φ1, φ2, φ3, and φ4, the output signal is respectively $S_{h1}=0$, $S_{h2}=0$, $S_{h1}+S_{h2}$, and $S_{h1}-S_{h2}$. The calculating section 64a of this example calculates φ1+φ2 and φ3+φ4. The calculating section 64a then calculates (φ1+φ2)−(φ3+φ4), according to the subtraction between φ1+φ2 and φ3+φ4. In other words, by calculating (φ1+φ2)−(φ3+φ4), the signal relating to the output signal $S_{h2}$ of the Hall element 12 is removed. In this way, it is possible to extract only the output signal $S_{h1}$ of the Hall element 11.

The calculating section 64a inputs the calculated difference (φ1+φ2)−(φ3+φ4) to the comparing section 65a. After this, the counter is updated according to the judgment result of the comparing section 65a. In one example, the counter is K=3. In this case, the counter adds together K=0, 1, 2, and the setting value of the DA converting section 67a at the timing when K=3 (i.e. K=0) is updated.

During the first feedback operation, the feedback circuit 60 extracts only the signal based on the output signal $S_{h1}$ of the Hall element 11 from the output signal $S_o$. In this way, the feedback circuit 60 controls the sensitivity of the Hall element 11.

Furthermore, in a similar manner during the second feedback operation, the offset of the Hall element 12 is removed according to the calculation using the calculating section 64b. The calculating section 64b removes the offset based on the output signals at the phases φ1, φ2, φ3, and φ4. At the phases φ1, φ2, φ3, and φ4, the output signal is respectively $S_{h1}=0$, $S_{h2}=0$, $S_{h1}+S_{h2}$, and $-S_{h1}+S_{h2}$. The calculating section 64b of this example calculates φ1+φ2 and φ3+φ4. The calculating section 64b then calculates (φ1+φ2)−(φ3+φ4), according to the subtraction between φ1+φ2 and φ3+φ4. In other words, by calculating (φ1+φ2)−(φ3+φ4), the signal relating to the output signal $S_{h1}$ of the Hall element 11 is removed. In this way, it is possible to extract only the output signal $S_{h2}$ of the Hall element 12.

The calculating section 64b inputs the calculated difference (φ1+φ2)−(φ3+φ4) to the comparing section 65b. After this, the counter is updated according to the judgment result of the comparing section 65b. In one example, the counter is K=3. In this case, the counter adds together K=0, 1, 2, and the setting value of the DA converting section 67b at the timing when K=3 (i.e. K=0) is updated.

During the second feedback operation, the feedback circuit 60 extracts only the signal based on the output signal $S_{h2}$ of the Hall element 12 from the output signal $S_o$. In this way, the feedback circuit 60 controls the sensitivity of the Hall element 12.

In the manner described above, the current sensor 100 of this example independently controls the drive currents of the Hall element 11 and the Hall element 12 using the feedback circuit 60 performing time-division operation, based on the output signal $S_o$ including both of the output signals $S_{h1}$ and $S_{h2}$. Accordingly, even in a case where there is a sensitivity difference between the Hall element 11 and the Hall element 12, the current sensor 100 of this example can self-correct the sensitivity of the magnetic element 10 with high accuracy.

Furthermore, since the current sensor 100 of this example operates with one system using the feedback circuit 60, there is no need to consider variation between systems. Accordingly, the current sensor 100 of this example has an even greater effect of correcting the sensitivity of the magnetic element 10.

Figure 8:
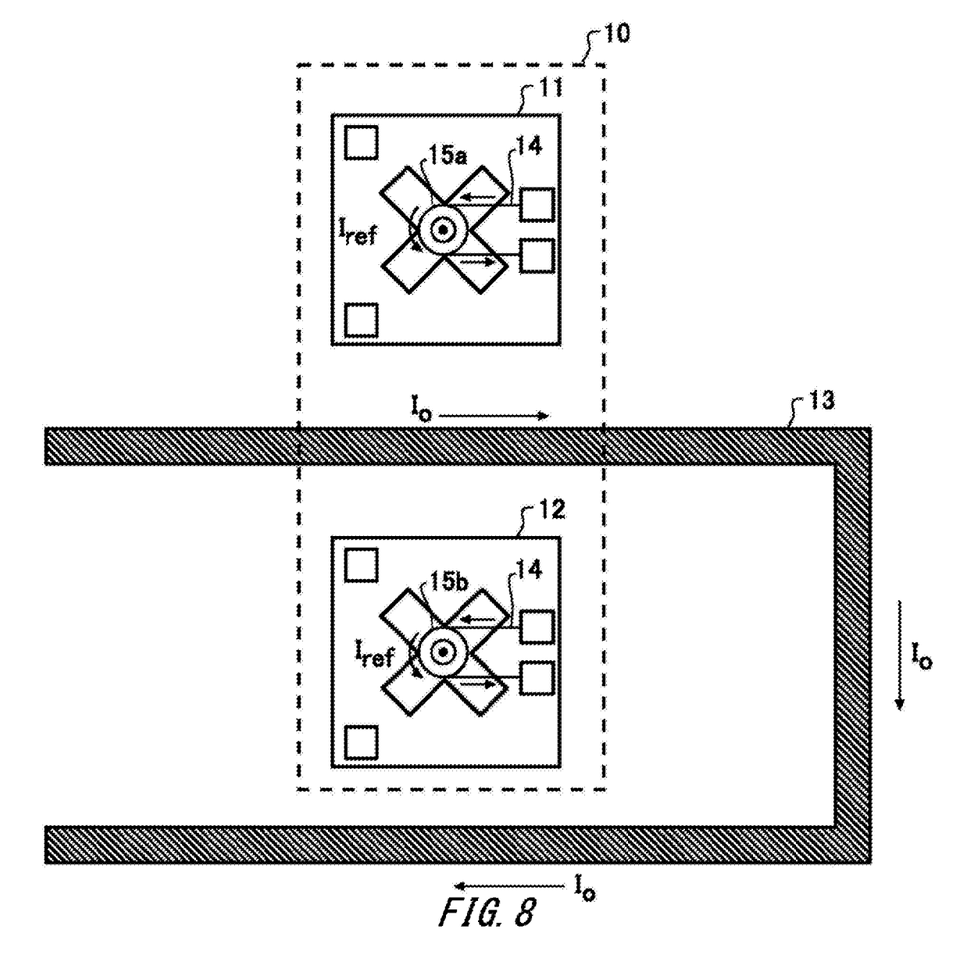
FIG. 8 shows a detailed exemplary configuration of the magnetic element 10.

FIG. 8 shows a detailed exemplary configuration of the magnetic element 10. This drawing is, in particular, an enlarged view of a region around the Hall element 11 and the Hall element 12. The Hall element 11 and the Hall element 12 of this example are connected to each other in parallel. The magnetic element 10 of this example includes Hall elements formed by compound semiconductors, but the magnetic element 10 is not limited to this.

The secondary conductor 14 of this example is formed on the same substrate as the magnetic element 10. The secondary conductor 14 and the magnetic element 10 are covered by the same molded resin. In this example, the Hall element 11 and the Hall element 12 are both covered by the same molded resin. Furthermore, the primary conductor 13 is partially covered by the same molded resin that covers the secondary conductor 14 and the magnetic element 10, and a portion of the primary conductor 13 is exposed. In other words, the primary conductor 13 includes a portion that is covered by the same molded resin that covers the secondary conductor 14 and the magnetic element 10, and a portion that is not covered by this molded resin. In this example, the portion of the primary conductor 13 that applies the magnetic field to the magnetic element 10 is covered by the molded resin, and the portion of the primary conductor 13 to which the current is input is not covered by the molded resin.

The primary conductor 13 has the current under measurement $I_o$ flow therethrough, and applies the magnetic fields under measurement $B_{in}$ caused by the current under measurement $I_o$ to the Hall element 11 and the Hall element 12 with different polarities. The primary conductor 13 of this example is provided between the Hall element 11 and the Hall element 12. The primary conductor 13 of this example is provided between the Hall element 11 and the Hall element 12 in the same plane, but instead, the Hall element 11 and the Hall element 12 may be provided on a front plane side and a rear plane side of the plane in which the primary conductor 13 is provided. The primary conductor 13 of this example applies the magnetic fields under measurement $B_{in}$ to the Hall element 11 and the Hall element 12 with different polarities, and therefore it is possible to cancel out a disturbance magnetic field with simple subtraction. A disturbance magnetic field is an offset magnetic field with the same polarity input to the Hall element 11 and the Hall element 12. In this way, it becomes easy to realize accuracy for the output signal $S_{out}$ from the output section 20, which is the main path of the current sensor 100. On the other hand, with the method of applying magnetic fields under measurement $B_{in}$ to the Hall element 11 and the Hall element 12, the current under measurement $I_o$ can be detected using addition, but a complex calculation is required to cancel out the disturbance magnetic field. The primary conductor 13 of this example is provided between the Hall element 11 and the Hall element 12 with equal intervals therebetween. It should be noted that the distance relationship between the primary conductor 13 and the Hall element 11 and Hall element 12 is not limited to this example.

The secondary conductor 14 includes a coil section 15a corresponding to the Hall element 11 and a coil section 15b corresponding to the Hall element 12. The Hall element 11 is caused to generate the reference magnetic field $B_{ref}$ due to the reference current $I_{ref}$ flowing through the coil section 15a. The Hall element 12 is caused to generate the reference magnetic field $B_{ref}$ due to the reference current $I_{ref}$ flowing through the coil section 15b.

The coil section 15a and the coil section 15b of this example apply the reference magnetic fields $B_{ref}$ with the same polarity to the Hall element 11 and the Hall element 12, by being wound in the same direction. Alternatively, the coil section 15a and the coil section 15b may be wound in different directions. In this case, the reference magnetic fields $B_{ref}$ with the same polarity are applied to the Hall element 11 and the Hall element 12 by causing the same current to flow in opposite directions through the coil section 15a and the coil section 15b. The number of windings of the coil section 15a is the same as the number of windings of the coil section 15b. By configuring the coil section 15a and the coil section 15b to have the same number of windings, a common reference current $I_{ref}$ can be made to flow. In this example, the two coil sections 15a and 15b are provided respectively to the Hall element 11 and the Hall element 12, but instead, one coil section surrounding both the Hall element 11 and the Hall element 12 may be provided. In this case as well, reference magnetic fields $B_{ref}$ with the same polarity can be applied to the Hall element 11 and the Hall element 12.

The secondary conductor 14 has the reference current $I_{ref}$ flow therethrough, and applies the reference magnetic fields $B_{ref}$ caused by the reference current $I_{ref}$ to the Hall element 11 and the Hall element 12 with the same polarity. Due to using a common current, the secondary conductor 14 of this example applies magnetic fields with the same polarity to the Hall element 11 and the Hall element 12. A common current refers to the current flowing in one coil section also flowing through the other coil section, due to the coil section 15a generating the reference magnetic field $B_{ref}$ for the Hall element 11 and the coil section 15b generating the reference magnetic field $B_{ref}$ for the Hall element 12 being electrically connected.

As described above, the magnetic element 10 of this example is configured in a manner to apply magnetic fields under measurement $B_{in}$ with different polarities to the Hall element 11 and the Hall element 12 and to apply reference magnetic fields $B_{ref}$ with the same polarity to the Hall element 11 and the Hall element 12. Therefore, it is possible to cancel out the magnetic fields under measurement $B_{in}$ and disturbance magnetic fields and to detect the current under measurement $I_o$, using a simple subtraction operation performed by the output section 20. Accordingly, the current sensor 100 using the magnetic element 10 of this example can detect the current under measurement $I_o$ with high accuracy.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A current sensor comprising:
   a first Hall element;
   a second Hall element;
   a primary conductor arranged in a manner to have a current under measurement flow therethrough and to apply magnetic fields under measurement caused by the current under measurement, with different polarities, to the first Hall element and the second Hall element; and
   a secondary conductor arranged in a manner to have a reference current flow therethrough and to apply reference magnetic fields caused by the reference current, with the same polarity, to the first Hall element and the second Hall element,
   wherein the secondary conductor includes:
      a first coil section arranged in a manner to apply the reference magnetic field to the first Hall element; and
      a second coil section arranged in a manner to apply the reference magnetic field to the second Hall element, and
   the first coil section and the second coil section are wound in the same direction.

2. The current sensor according to claim 1, wherein
   the secondary conductor is formed on a substrate on which the first Hall element and the second Hall element are formed,
   the secondary conductor, the first Hall element, and the second Hall element are covered by a same molded resin, and
   the primary conductor includes a portion that is covered by the same molded resin and a portion that is not covered by the same molded resin.

3. The current sensor according to claim 1, further comprising:
   an output section that outputs a signal corresponding to the current under measurement, based on output signals of the first Hall element and the second Hall element, wherein
   the output section includes a subtracting section that outputs a subtraction result between the output signal of the first Hall element and the output signal of the second Hall element.

4. The current sensor according to claim 1, wherein the primary conductor is provided between the first Hall element and the second Hall element.

5. The current sensor according to claim 1, wherein the first coil section and the second coil section are electrically connected to each other, and apply the reference magnetic fields with the same polarity to the first Hall element and the second Hall element, due to the reference current that is common thereto.

6. The current sensor according to claim 1, wherein the number of windings of the first coil section is the same as the number of windings of the second coil section.

7. The current sensor according to claim 1, further comprising:
a control section that controls driving of the first Hall element based on output signals from the first Hall element and the second Hall element, and controls driving of the second Hall element, separately from the control of the driving of the first Hall element, based on the output signals from the first Hall element and the second Hall element.

8. The current sensor according to claim 7, wherein the control section further comprises:
a first feedback circuit that controls driving of the first Hall element based on the output signals from the first Hall element and the second Hall element; and
a second feedback circuit that controls driving of the second Hall element based on the output signals from the first Hall element and the second Hall element.

9. The current sensor according to claim 8, further comprising:
a first chopper circuit provided between the first feedback circuit and the second Hall element, wherein
the first feedback circuit has the output signal of the second Hall element whose polarity has been switched by the first chopper circuit and the output signal of the first Hall element whose polarity has not been switched input thereto.

10. The current sensor according to claim 8, further comprising:
a second chopper circuit provided between the second feedback circuit and the first Hall element, wherein
the second feedback circuit has the output signal of the first Hall element whose polarity has been switched by the second chopper circuit and the output signal of the second Hall element whose polarity has not been switched input thereto.

* * * * *